United States Patent [19]

Nanba et al.

[11] Patent Number: 5,109,263
[45] Date of Patent: Apr. 28, 1992

[54] SEMICONDUCTOR DEVICE WITH OPTIMAL DISTANCE BETWEEN EMITTER AND TRENCH ISOLATION

[75] Inventors: Mitsuo Nanba, Hinode; Tohru Nakamura, Tanashi; Kazuo Nakazato, Kokubunji; Takeo Shiba, Kodaira; Katsuyoshi Washio, Tokorozawa; Kiyoji Ikeda; Takahiro Onai, both of Hachioji; Masatada Horiuchi, Koganei, all of Japan

[73] Assignee: Hitachi, Ltd., Tokyo, Japan

[21] Appl. No.: 556,365

[22] Filed: Jul. 24, 1990

[30] Foreign Application Priority Data

Jul. 28, 1989 [JP] Japan .................................. 1-194108
Sep. 8, 1989 [JP] Japan .................................. 1-231736

[51] Int. Cl.$^5$ .......................................... H01L 29/72
[52] U.S. Cl. .................................... 357/34; 357/49; 437/31
[58] Field of Search ...................... 357/34, 49; 437/31

[56] References Cited

U.S. PATENT DOCUMENTS

| | | | |
|---|---|---|---|
| 4,531,282 | 7/1985 | Sakai et al. | 437/36 |
| 4,641,416 | 2/1987 | Iranmanesh et al. | 437/36 |
| 4,829,015 | 5/1989 | Schaber et al. | 437/31 |
| 4,933,733 | 6/1990 | Iranmanesh et al. | 357/34 |
| 4,963,957 | 10/1990 | Ohi et al. | 357/49 |

OTHER PUBLICATIONS

Kikuchi et al *IEDM* Dec. 1986 pp. 420–423 "A High-Speed Bipolar LSI ... Technology".

Primary Examiner—Jerome Jackson, Jr.
Attorney, Agent, or Firm—Antonelli, Terry, Stout & Kraus

[57] ABSTRACT

A vertical bipolar transistor arrangement in which the distance between the emitter and the isolation region is kept within a range determined by the sum of emitter depth and base width (i.e., the thickness of the base in the depth direction). This keeps the carriers given by the emitter from getting trapped inside, thereby preventing the cut-off frequency from dropping.

9 Claims, 13 Drawing Sheets

SEMICONDUCTOR DEVICE WITH OPTIMAL DISTANCE BETWEEN EMITTER AND TRENCH ISOLATION

BACKGROUND OF THE INVENTION

The present invention relates to a semiconductor device and, more particularly, to a bipolar type semiconductor device suitable for use in applications of high cut-off frequencies and high-speed operations.

Figure 1:
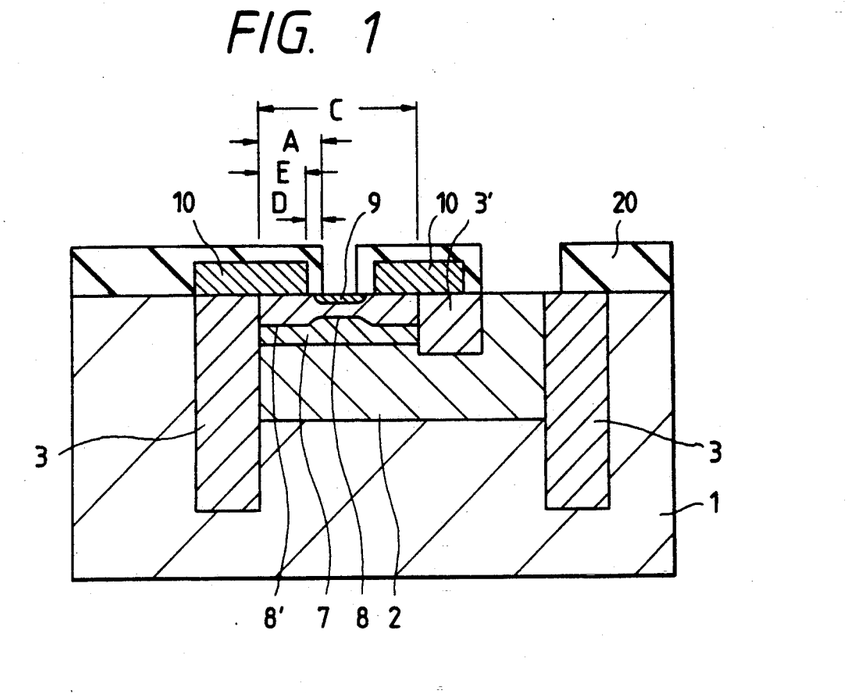
FIG. 1 is a cross section of a prior art bipolar transistor.

Prior art semiconductor devices comprising a bipolar transistor construction have aimed at high-speed operations by reducing the area of the extrinsic base region, as disclosed in Japanese Patent Laid-open No. 56-142667. FIG. 1 shows a cross-section of one such semiconductor device. In this figure, a semiconductor substrate 1 comprises a collector 2 and isolation regions 3 and 3'. A region C enclosed by the isolation regions 3 and 3' is known as a silicon island which includes an emitter 9. Below the emitter 9 is a base 8. An extrinsic base region 8' surrounding the emitter 9 is electrically connected to the outside via a polycrystalline silicon film 10. This structure reduces the area of the extrinsic base region 8' while minimizing a distance D between emitter 9 and polycrystalline silicon film 10 so that the base resistance may also be lowered. In FIG. 1, reference character 7 is an N-type epitaxial layer; 20 is an insulating film; A is the distance between emitter 9 and isolation region 3; and E is the distance between intrinsic base region 8' and isolation region 3.

One disadvantage of the above-mentioned prior art has been the lack of consideration for the distance A between emitter 9 and isolation region 3 with respect to the time constant of the transistor construction. This has led to the failure to acquire a high and stable cut-off frequency $f_T$.

Another disadvantage of the above prior art has been its inability to fix the position of the emitter 9 relative to the isolation region 3 due to the mask alignment error stemming from emitter formation. Because the distance A between isolation region 3 and emitter 9 is variable, it is difficult to minimize the width of the extrinsic base region 8'. This has been a significant impediment to raising the cut-off frequency.

SUMMARY OF THE INVENTION

It is therefore an object of the present invention to provide a semiconductor device which provides a stable, high cut-off frequency $f_T$ by solving the problems experienced with the related prior art.

It is another object of the present invention to provide a semiconductor device having a small extrinsic base region on a semiconductor chip, along with a method for manufacturing such a device.

In carrying out the invention, there is provided a semiconductor device wherein the distance A between the emitter (which acts as the collector when the transistor is in upward operation) in the surface region of the semiconductor substrate and the isolation region thereof remains within a predetermined value. That is, the distance A is limited to a range determined by the sum of the base width (distance between emitter-base junction immediately under emitter and base-collector junction) and the emitter junction depth. This construction makes it possible to reduce the necessary area of the extrinsic base region and to implement a high cut-off frequency.

BRIEF DESCRIPTION OF THE DRAWINGS:

FIGS. 6 (a) through 6 (k) are process drawings showing processes for manufacturing the semiconductor device depicted in FIG. 2;

FIGS. 14 (a) through 14 (f) are process drawings illustrating processes for manufacturing an embodiment of the present invention.

Figure 3:
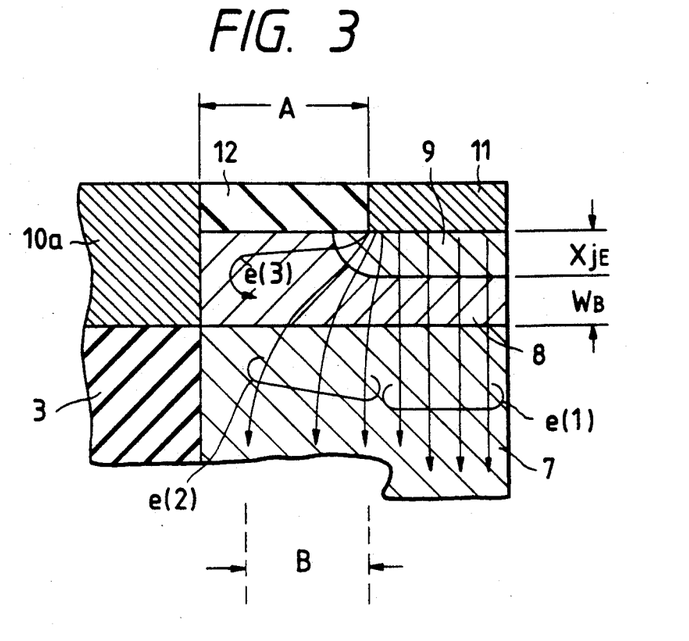
FIG. 3 is a cross section that helps to describe the operating principles of the embodiment.

DETAILED DESCRIPTION OF THE PREFERRED EMBODIMENTS:

FIG. 3 shows a cross section of a bipolar transistor embodying the invention, the point of view being taken close to the emitter thereof. An emitter 9 is formed with a junction depth of $X_{jE}$ by a known thermal diffusion method whereby impurities of a polycrystalline silicon film 11 are diffused in the substrate surface. A base 8 is formed below and around the emitter 9 with a base width $W_B$ (distance between emitter-base junction and base-collector junction). The base 8 is connected to a polycrystalline silicon film 10a for base diffusion. Leader lines e (1), e (2) and e (3) indicate the routes along which electron carriers injected from the emitter 9 flow. Of the electron carriers injected from the emitter 9, those indicated by leader line e (1) flow perpendicularly from the emitter 9 to a collector 7. The electron carriers indicated by leader line e (2) are those injected from the side wall and edge of the emitter 9; they expand by a distance B while flowing to the collector 7.

Where the relations are not appropriate between the sum of the junction depth $X_{jE}$ and the base width $W_B$ ($X_{jE}+W_B$) on the one hand and the distance A on the other, it becomes difficult for the electron carriers indicated by leader lines e (2) and e (3), especially those pointed to by e (3), to flow to the collector 7; they tend to remain within the base 8. The electron carriers indicated by leader line e (3) constitute a large time constant which prevents implementation of a high cut-off frequency $f_T$.

According to this applicant's experiments, it became clear that a sufficiently long distance A ensures a high cut-off frequency $f_T$. However, as shown in FIG. 1, making the distance A longer tends to increase the area of the extrinsic base region 8', which is not desirable. To obtain a high cut-off frequency $f_T$ while the area of the extrinsic base region 8' is minimized requires not only suitably determining the distanct A; it is also necessary to determine the respective values of $X_{jE}$, $W_B$ and distance A in a way that keeps appropriate relations therebetween.

Figure 4:
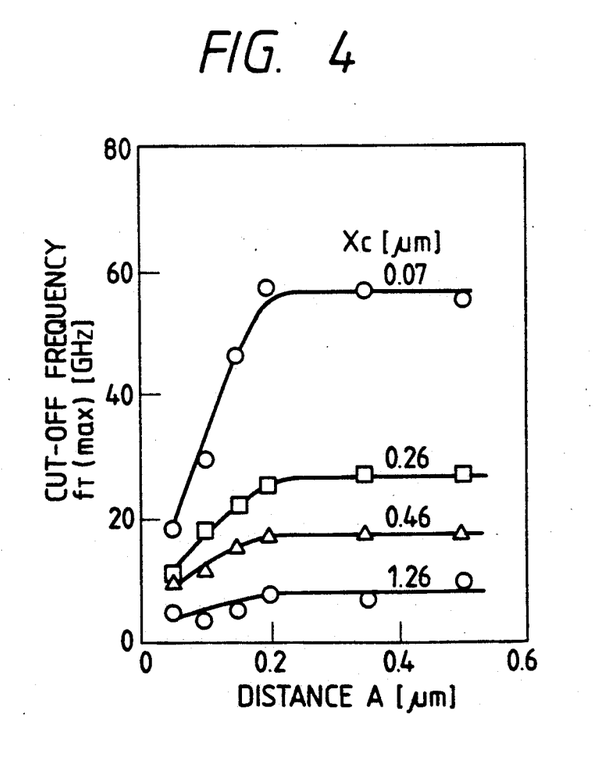
FIGS. 4 and 5 are graphic charts that help to describe the operating principles of the embodiment.
Figure 5:
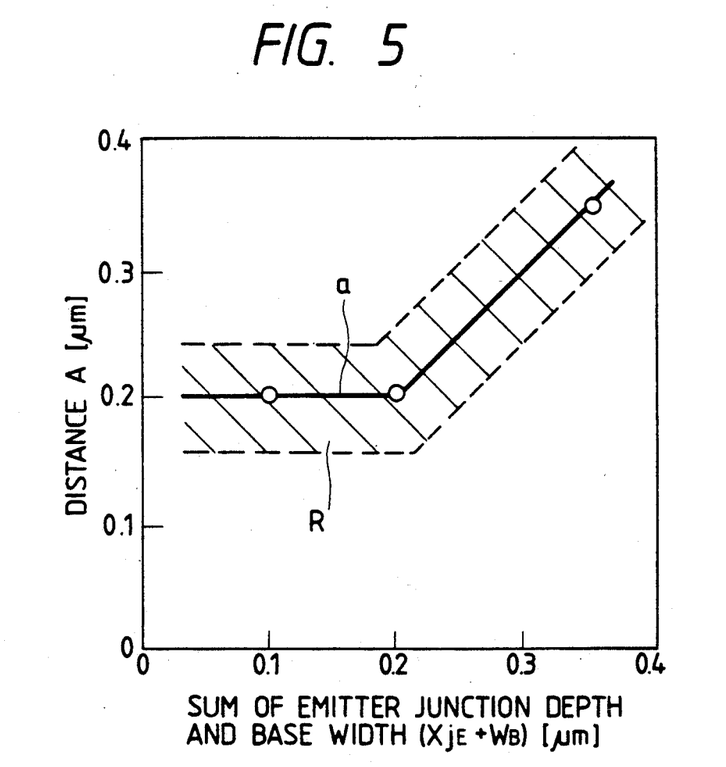

FIG. 4 depicts how the distance A is related to the cut-off frequency $f_T$, and FIG. 5 illustrates how the distance A is related to the sum of the emitter junction depth and base width $(X_{jE}+W_B)$ where $X_{jE}$ is 0.04 μm and $W_B$ 0.06 μm so that the sum of the two values is 0.1 μm, with a collector thickness $X_C$ used as a parameter. As shown in FIG. 4, increasing the distance A raises the cut-off frequency $f_T$ until the latter is saturated when the distance A is 0.2 μm or longer. Furthermore, the distance A is not dependent on the collector thickness $X_C$. Where the value $X_C$ ranges from 0.07 to 1.26 μm, a high cut-off frequency $f_T$ is obtained by setting the distance A to 0.2 μm or greater.

FIG. 5 shows how an optimum distance A is related to the sum of $(X_{jE}+W_B)$. In this figure, solid line "a" indicates the distance A at which the highest cut-off frequency $f_T$ is available with respect to the sum of $(X_{jE}+W_B)$. As illustrated, when the sum of $(X_{jE}+W_B)$ is more then 0.2 μm, making the distance A equal to that sum provides the highest cut-off frequency $f_T$; when the sum is 0.2 μm or less, setting the distance A to 0.2 μm provides the highest cut-off frequency.

In practice, the cut-off frequency $f_T$ may be a little lower than its highest possible value. Thus FIG. 5 shows a region R respresenting a range of practically preferable distances A. Staying within the region R ensures 80 percent or more of the highest possible cut-off frequency $f_T$. In FIG. 5, the region R encompasses a 20-percent distance range on both sides of solid line "a". It follows that when the sum of $(X_{jE}+V_B)$ is 0.2 μm or less, the distance A may be any value between 0.16 and 0.24 μm; when the sum of $(X_{jE}+V_B)$ is more than 0.2 μm, the distance A may be made 0.8 to 1.2 times the sum. Setting the respective values in this manner ensures a sufficiently high cut-off frequency $f_T$ while minimizing the increase of the distance A for high integration density.

First Embodiment

Figure 2:
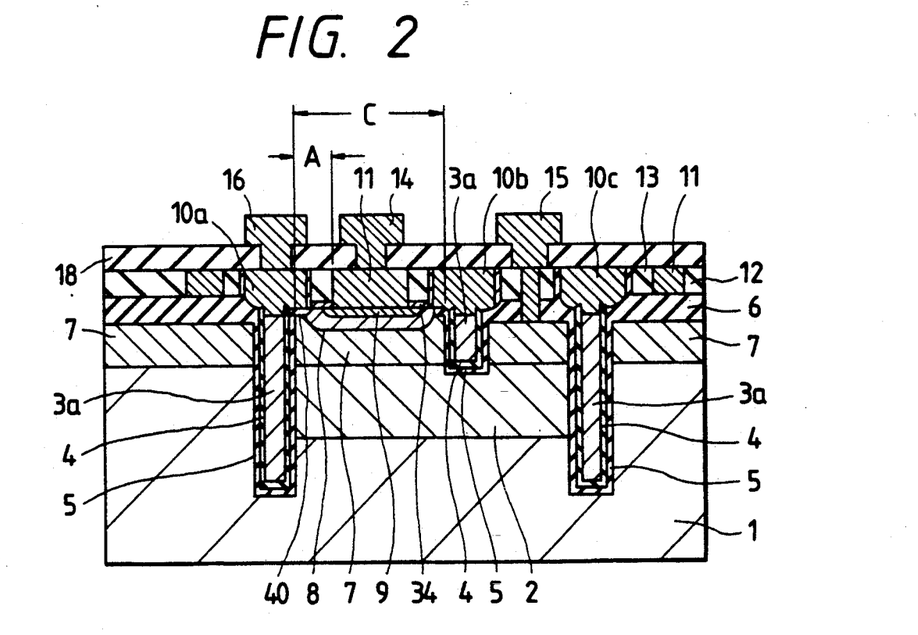
FIG. 2 is a cross section of a semiconductor device which is a first embodiment of the present invention.
Figure 6A:
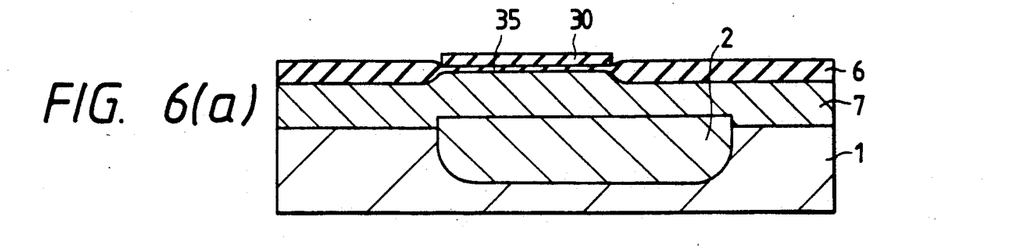

FIG. 2 illustrates in cross-sectional format the semiconductor device which is the first embodiment of the invention. How this transistor is manufactured will now be described by referring to FIGS. 6 (a) through 6 (k). As shown in FIG. 6 (a), a P-type substrate 1 with a resistivity of 20 Ω.cm has a source of Sb. Thermal diffusion is carried out at 1175° C. for 45 minutes to form an N+ buried layer 2 having a sheet resistance of 30 Ω.cm and a junction depth of 1.2 μm. By using the known epitaxial growth method, silicon deposits are allowed to grow on the above-mentioned silicon substrate so that an N-type epitaxial layer 7 having a thickness of 0.5 μm is formed thereon. The layer is subjected to heat treatment in a dry oxide atmosphere to become an SiO2 film 35 having a thickness of 300 Å. Over the N+ buried layer 2, an Si3N4 film 30 with a thickness of 1,000 Å is formed by the known CVD method. With the Si3N4 film 30 used as the mask, the whole thing is subjected to heat treatment at 1,000° C. for 40 minutes in a vapor atmosphere. The result is a silicon oxide film 6 with a thickness of 2,500 Å.

Figure 6B:
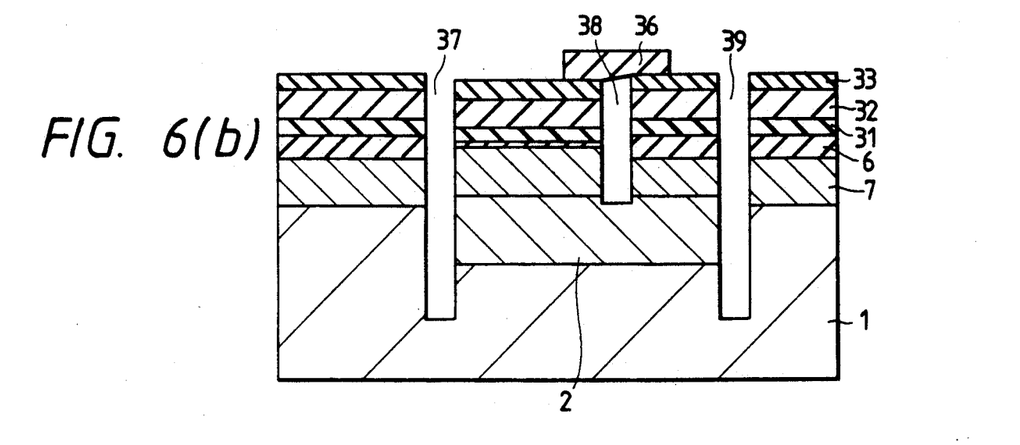

With the Si3N4 film 30 removed, the CVD method is used to form an Si3N4 film 31 with a thickness of 1,200 Å, SiO2 film 32 with a thickness of 4,000 Å and Si3N4 film 33 with a thickness of 1,200 Å. Trenches 37, 38 and 39 reaching the N+ buried layer 2 are formed by the known photolithography and dry etching methods. A photo-resist film 36 covering the trench 38 is used as the mask for dry etching so that the bottoms of the trenches 37 and 39 extend deeper than the N+ buried layer 2, as shown in FIG. 6 (b).

After an SiO2 film 5 with a thickness of 100 Å is formed by the known thermal oxidation method, an Si3N4 film 31 is side-etched by thermal phosphating. At this point, the temperature is adjusted so as to attain the amount of side etching of 0.05 μm.

Figure 6C:
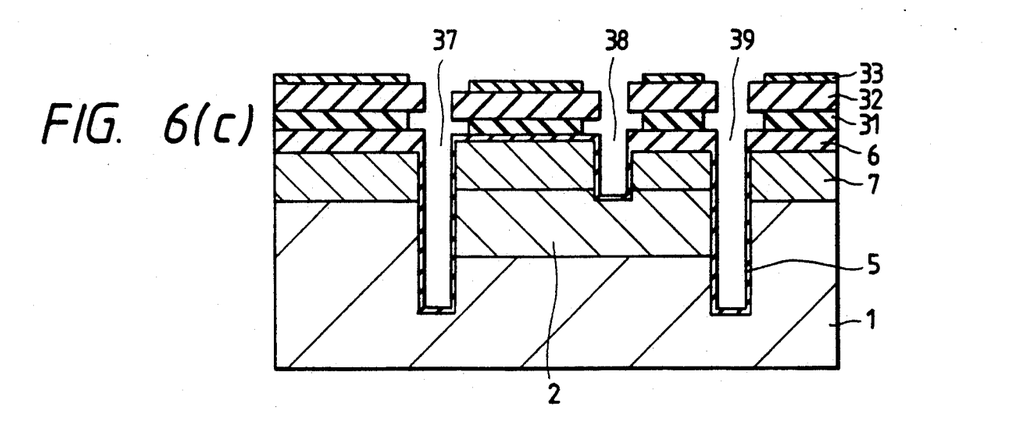
Figure 6D:
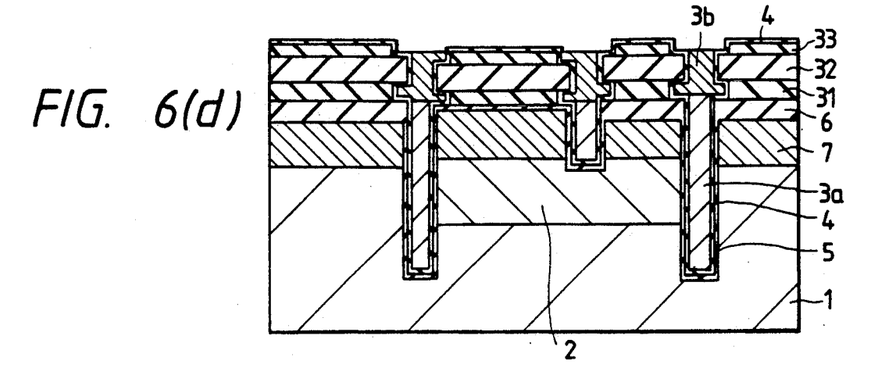
Figure 6E:
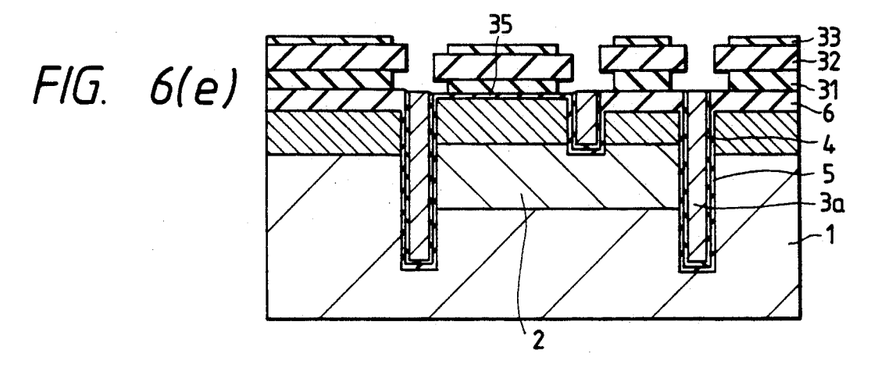

An Si3N4 film 4 with a thickness of 100 Å is formed by the CVD method. After this, the low-pressure CVD method is used to bury SiO2 portions 3a and 3b into the trenches 37, 38 and 39 as depicted in FIG. 6(d). An SiO2 portion formed on top, not shown, is removed to provide a flat surface. Then the buried SiO2 portion 3b is removed by wet etching, and the exposed portion of the Si3N4 film 4 is also removed likewise.

Figure 6F:
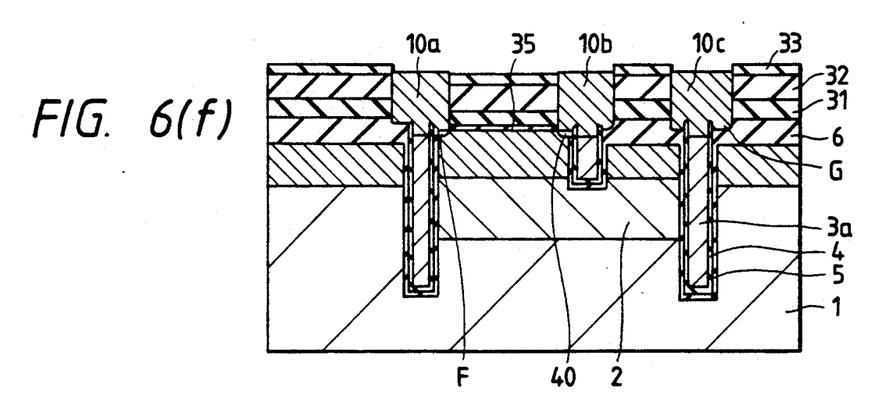

Thereafter, an SiO2-ready etching solution is used to remove the SiO2 film 35 from a graft base contact region F. At this point, a region G of the silicon oxide film 6 is etched to make the film thinner. Simultaneously, the SiO2 film 32 is side-etched. A polycrystalline silicon film with a thickness of 8,000 Å is formed over the entire surface by the CVD method. With polycrystalline silicon portions 10a, 10b and 10c left intact in their concave areas, the polycrystalline silicon film on other areas are removed by dry etching to provide a flat surface. Using a photo-mask, B+ ions with a dose of 1E16 cm$^{-2}$ are injected at an acceleration voltage of 50 keV into the polycrystalline silicon portions 10a and 10b. Then N2 annealing is carried out at 900° C. for 10 minutes to form a graft base 40 with a thickness of 50 Å, as illustrated in FIG. 6(f).

The Si3N4 film 33, SiO2 film 32, Si3N4 film 31 and SiO2 film 35 are successively removed by the known etching method. Thereafter, oxidation treatment is carried out in a vapor atmosphere at 800° C. to form an SiO2 film 34 with a thickness of 300 Å. At this point, the surfaces of the polycrystalline silicon portions 10a, 10b and 10c are also oxidized to form a silicon oxide film 13. Then BF2+ ions are injected at an acceleration voltage of 20 KeV to form the base 8.

An Si3N4 film 41 with a thickness of 1,500 Å is formed by the known CVD method and, as shown in FIG. 6 (i), the film 41 is removed by anisotropic etching, leaving the perpendicular wall portions thereof intact. This exposes the SiO2 film 13 on the side walls of the B-doped polycrystalline silicon portions 10a and 10b as well as of the undoped polycrystalline silicon portion 10c.

Figure 6G:
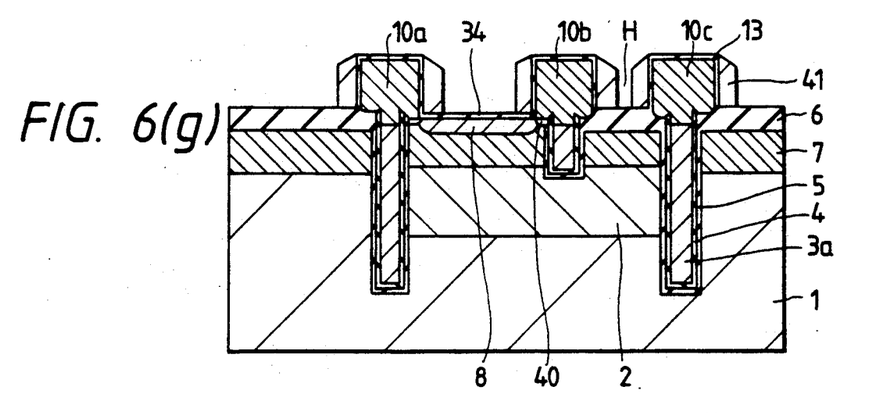
Figure 6H:
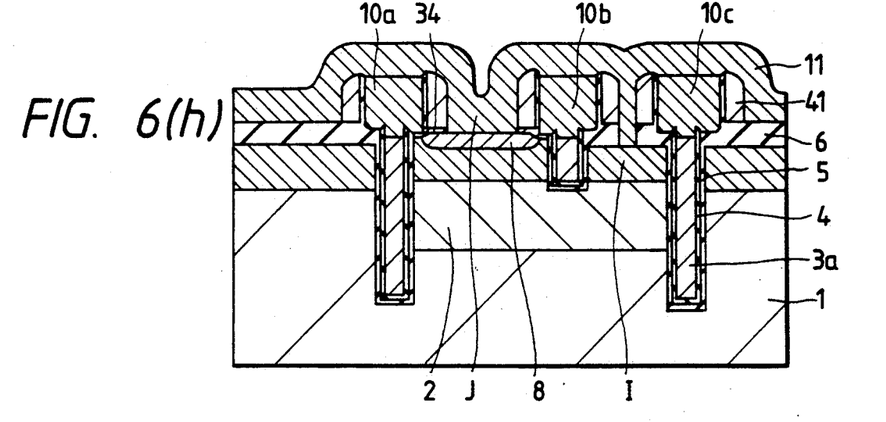

After a region H of the silicon oxide film 6 shown in FIG. 6(g) is removed by photolithography and dry etching, P+ ions are injected to form an N+ layer in a region I, as depicted in FIG. 6(h). With the SiO2 film 34 removed from a region J, the polycrystalline silicon film 11 doped with a large amount of As is formed over the surface.

Figure 6I:
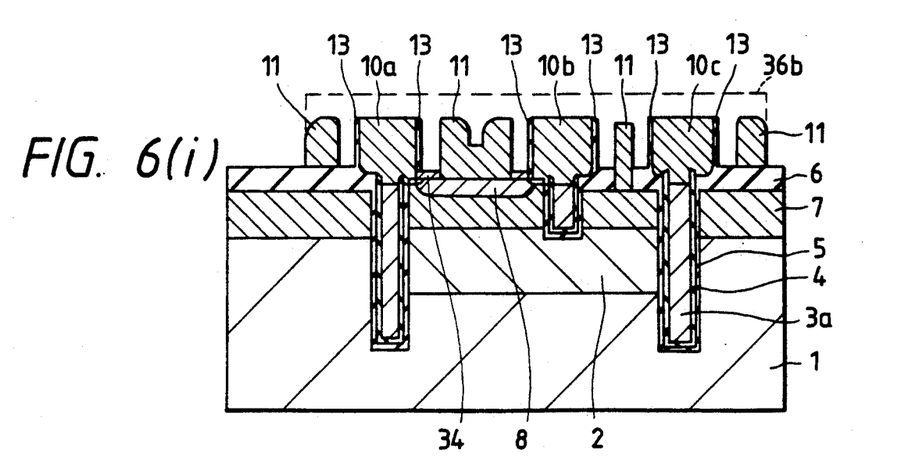

After the whole surface is covered with a photoresist coat, it is dry-etched to become a flat surface. Then the Si3N4 film 41 is removed by etching to form a construction with the polycrystalline silicon portions 10a, 10b and 10c projecting, as shown in FIG. 6(i). A photoresist mask 36b is formed (indicated by broken line), and the exposed portions of the As-doped polycrystalline silicon film 11 are removed by dry etching.

Figure 6J:
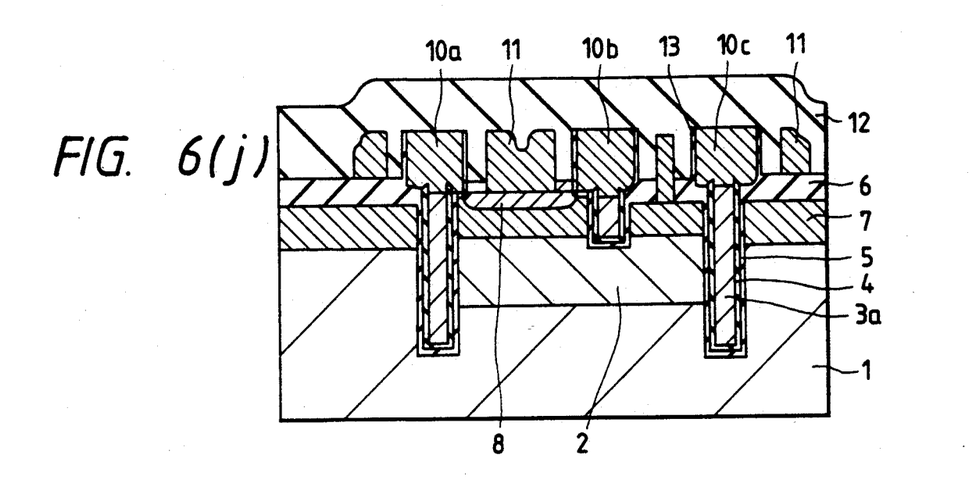
Figure 6K:
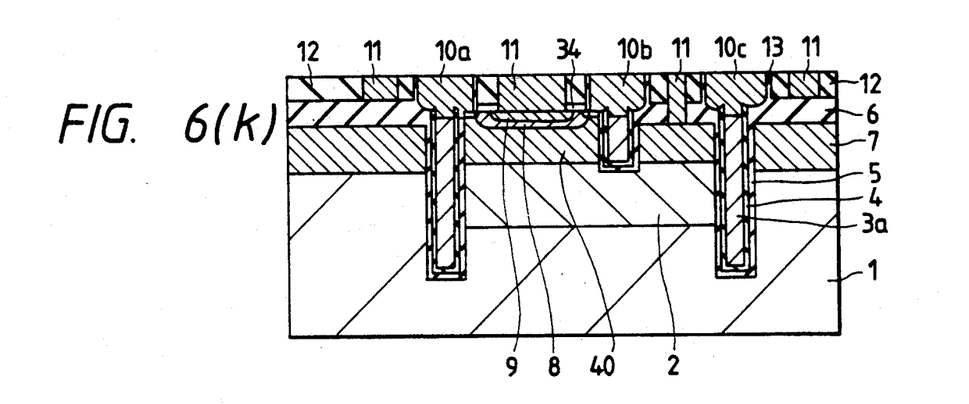

An SiO2 film 12 with a thickness of 2 μm is formed by the known CVD method, as illustrated in FIG. 6(j). After a photo-resist film, not shown, is formed, the whole surface is subjected to dry etching so that the SiO$_2$ film 12 is reduced to a thickness of about 0.1 μm. At the same time, the surfaces of the As-doped polycrystalline silicon film 11, B-doped polycrystalline silicon portions 10a and 10b, and undoped polycrystalline silicon portion 10c are exposed and are etched a little more. Then annealing is performed at 890° C. for 20 minutes so that As particles are diffused from the As-doped polycrystalline silicon film 11 into the base 8 to form the emitter 9, as shown in FIG. 6(k). This provides a transistor having an emitter junction depth of 400 Å and a base width of 600 Å.

Thereafter, prior art processes are used to form an SiO$_2$ film 18, contact holes, and electrodes 14, 15 and 16, thereby completing the semiconductor device illustrated in FIG. 2.

The bipolar transistor produced as the first embodiment of the invention has the emitter junction depth X$_{jE}$ and base width W$_B$ of 0.04 μm and 0.06 μm, respectively, the sum of both being 0.1 μm, as stated above. With this embodiment, the distance A is 0.2 μm. The emitter measures 0.5 by 1.85 μm$^2$. The region C, or what is known as the silicon island, measures 0.9 by 2.25 μm$^2$. The epitaxial layer 7 has a thickness X$_C$ of 0.15 μm, and the cut-off frequency f$_T$ is 40 GHz. The base-collector capacitance C$_{TC}$ is 1.33 fF.

Second Embodiment

The second embodiment of the invention is a modified version of the first embodiment, the modification being that the distance A between the emitter 9 and the isolation region is set to 0.16 μm, with the other dimensions left the same as in the first embodiment. This reduces the area of the region C of this semiconductor device to 0.82 by 2.17 μm$^2$, with the frequency f$_T$ dropped to 32 GHz and the capacitance C$_{TC}$ lowered by 12 percent.

Third Embodiment

The third embodiment of the invention is also a modified version of the first embodiment, the modification being that the distance A between the emitter 9 and the isolation region is set to 0.24 μm, with the other dimensions left the same as in the first embodiment. As the area of the region C is made greater than in the first embodiment, the capacitance C$_{TC}$ becomes larger by 13 percent than in that embodiment, whereas the cut-off frequency f$_T$ is set to 40 GHz. That is, the capacitance C$_{TC}$ is smaller by 35 percent than with conventional semiconductor devices of the comparable class.

Fourth Embodiment

The fourth embodiment of the invention is also a modified version of the first embodiment, the modification being that the surface region of the polycrystalline silicon portions 10a and 10b is replaced by a W (tungsten) silicide coating, with the other aspects left the same as in the first embodiment. That is, the manufacturing processes shown in FIGS. 6(a) through 6(k) are carried out first, followed by the formation of a W film over the polycrystalline silicon portions 10a and 10b. After heat treatment, the polycrystalline silicon portions 10a and 10b are coated with W silicide over their surfaces so that the resistance of these portions is reduced to 1/10 or less of that of the comparable prior art device. This leads to a lowered base resistance and a 20 percent improvement of the ring oscillator speed.

Fifth Embodiment

Figure 7:
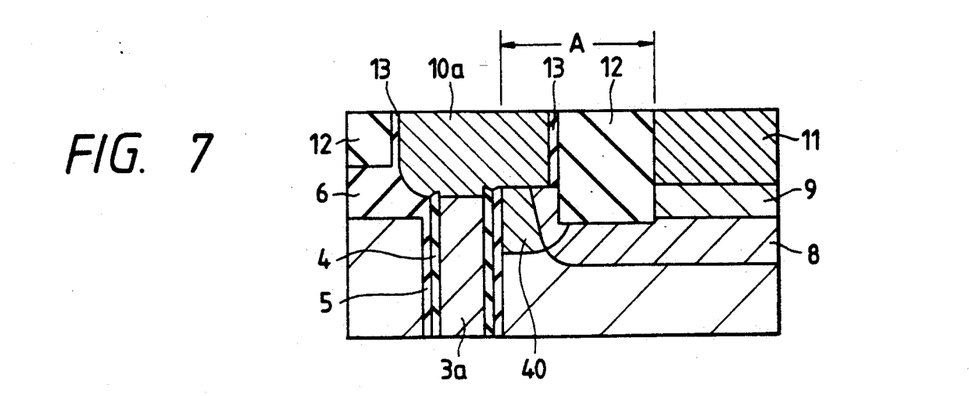
FIG. 7 is a cross section of a second embodiment of the present invention.

FIG. 7 illustrates in cross sectional format the second embodiment of the invention, the point of view being taken close to the emitter thereof and its surroundings. Except for these portions, the fifth embodiment is virtually the same as the semiconductor depicted in FIG. 2. As shown FIG. 7, the side wall of the emitter 9 is covered with the SiO$_2$ film 12 so as to prevent the outflow of carries from the wall. This makes it possible to eliminate the trapped carries indicated by leader line e (3) in FIG. 3. With the fifth embodiment, shortening the distance A down to 0.05 μm still affords the same cut-off frequency f$_T$ as when the distance A is 0.2 μm. Whereas the area of the region C is as small as 0.9 by 2.25 μm$^2$ in the first embodiment, that areas is made smaller still in the fifth embodiment: down to 0.6 by 1.95 μm$^2$. This results in a 43 percent reduction in the capacitance C$_{TC}$.

The absence of the side wall for the emitter junction in the fifth embodiment lowers by half the capacitance C$_{TC}$ (15.4 f$_F$) in the first embodiment. With the fifth embodiment, a reduced junction depth of the graft base 40 enhances the current amplification factor and dielectric strength thereof.

When the transistor is in upward operation, the characteristics thereof are affected by a ratio of S$_B$/S$_E$, S$_E$ being the base area and S$_E$ the emitter area thereof in effect in downward operation. The fifth embodiment provides an improved S$_B$/S$_E$ ratio of 0.79, whereas the ratio is 0.45 for the first embodiment. The S$_E$/S$_B$ ratio is illustratively dicussed in IEEE, Trans. Electron Devices, ED-22 (1975), pp. 145–152.

How the fifth embodiment is manufactured will now be described. Using a P-type substrate, the processes shown in FIGS. 6(a) through 6(i) are carried out in the same manner as with the first embodiment. There are some exceptions: the Si$_3$N$_4$ film 31 for side etching in FIG. 6(c) is 0.02 μm in thickness, and the SiO$_3$N$_4$ film 41 in FIG. 6(g) has a thickness of 0.03 μm.

Then the SiO$_2$ film 34 is etched, followed by the N-type epitaxial film 7 begin etched deep enough in the next process to form an emitter layer in a concave shape. The processes of FIGS. 6(j) and 6(k) are preformed next to complete the semiconductor device depicted in FIG. 7.

In the fifth embodiment, the distance A is set to 0.05 μm. Even if the distance A is 0.1 μm, or 0.2 μm as in the first embodiment, covering the side wall of the emitter with an insulating film reduces the capacitance C$_{TC}$.

In this manner, the distance between emitter and isolation region is optimized so that a high, stable cut-off frequency may be obtained and that the bipolar transistor may operate at high speed.

Where the base layer and emitter layer are formed through self-alignment with respect to the isolation region, the emitter layer is precisely positioned where needed so as to reduce the area of the extrinsic base region on the substrate plane.

Sixth Embodiment

Figure 8:
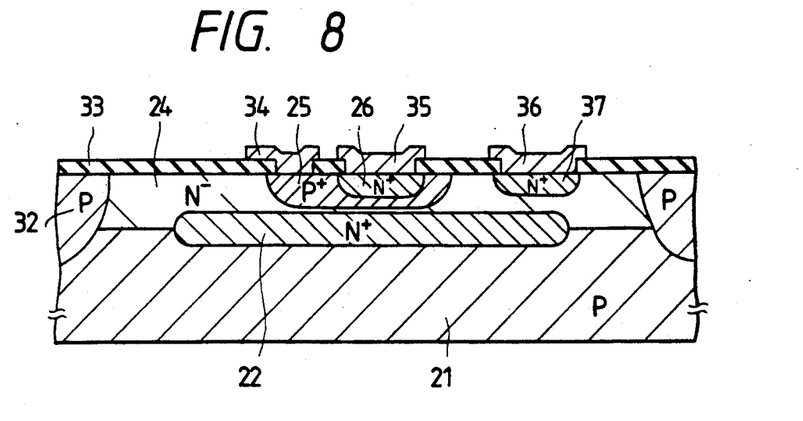
FIG. 8 is a cross section of another prior art bipolar transistor.

FIG. 8 shows a cross section of the representative planar structure bipolar transistor. In FIG. 8, reference numeral 21 is a P-type silicon substrate; 22 is an N+ buried layer; 24 is a collector; 25 is a base; 26 is an emitter; 32 is a P-type isolation region; 33 is an isolation film; 34, 35 and 36 are an electrode each; and 37 is a collector tapping region. As can be seen from FIG. 8, the prior art bipolar transistor has its N+ buried layer 22 forming the most flat structure immediately under the emitter 26.

The current gain of transistors generally drops in proportion to the frequency thereof. As is known, the frequency at which a transistor ceases its amplifying operation is called a cut-off frequency $f_T$. The cut-off frequency represents high frequency characteristics of the transistor, and is expressed by taking a reciprocal number of a time $\tau$ in which the amount of charge Q accumulated in the transistor is released with the collector current $I_C$ thereof. That is, $$f_T = \tfrac{1}{2}(\pi\tau) \qquad (1)$$

$$\tau = Q/I_C \qquad (2)$$

To improve the high frequency characteristics therefore requires reducing the amount of the accumulated charge Q and increasing the collector current $I_C$. Conventional mearsures to boost the operating speed of the transistor have typically involved minimizing the nonessential regions thereof and lowering the amount of charge therein. One such measure is illustratively proposed as a transistor construction disclosed by Japanese Patent Laid-open No. 56-1556.

The sixth embodiment provides a construction whereby the collector current is raised without any increase in the amount of the accumulated charge, thus improving high frequency characteristics.

When practiced, the sixth embodiment is a semiconductor device placed in a first conductivity type semiconductor substrate. The semiconductor device comprises a first region of a second conductivity type which is the opposite of the first conductivity type, a second region of the first conductivity type, a third region of the second conductivity type containing impurities at low concentration, and a fourth region of the second conductivity type containing impurities at high concentration. In this semiconductor device, a first boundary surface between the first and second regions, a second boundary surface between the second and third regions, and a third boundary surface betwen the third and fourth regions have a substantially constant curvature each. The distance to the second boundary surface is substantially equal to that to the first boundary surface, and the distance to the third boundary surface also is substantially equal to that to the second boundary surface.

In operation, the collector current of the transistor is determined by the degree of diffusion of the electrons as they are injected from the emitter and collected to the collector. This diffusion current flows as the electrons diffuse striving to become uniform in concentration. Thererfore, the greater the degree of diffusion, the larger the diffusion current.

Figure 9A:
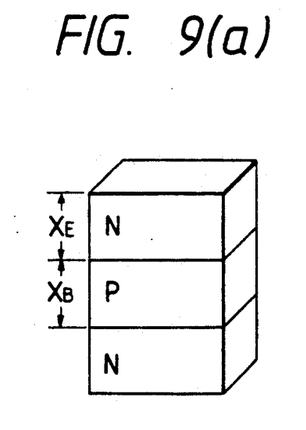
FIGS. 9(a)–9(c) are schematics depicting ideal constructions of the bipolar transistor.
Figure 9B:
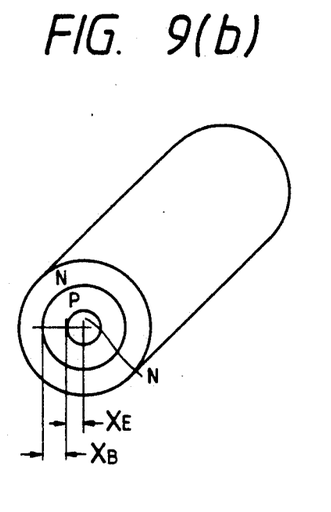
Figure 9C:
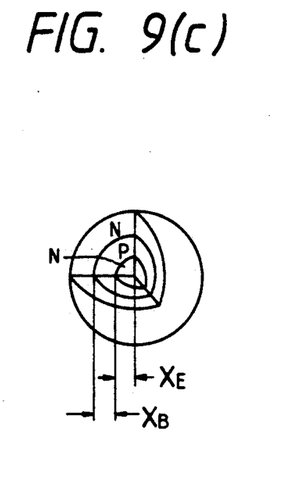

FIG. 9 contains a set of views showing how ideal transistors are constructed. FIG. 9(a) illustrates a block construction in which NPN impurities are distributed in one direction, the construction being uniform in two other directions. FIG. 9(b) depicts a cylindrical construction in which the NPN impurity distribution is taken cylindrically, the construction being uniform in the other direction. FIG. 9(c) shows a spherical construction in which NPN impurities are distributed spherically. These are called a d-dimensional construction each, the value "d" being 1 for the construction in FIG. 9(a), 2 for that in FIG. 9(b) and 3 for that in FIG. 9(c).

Figure 10:
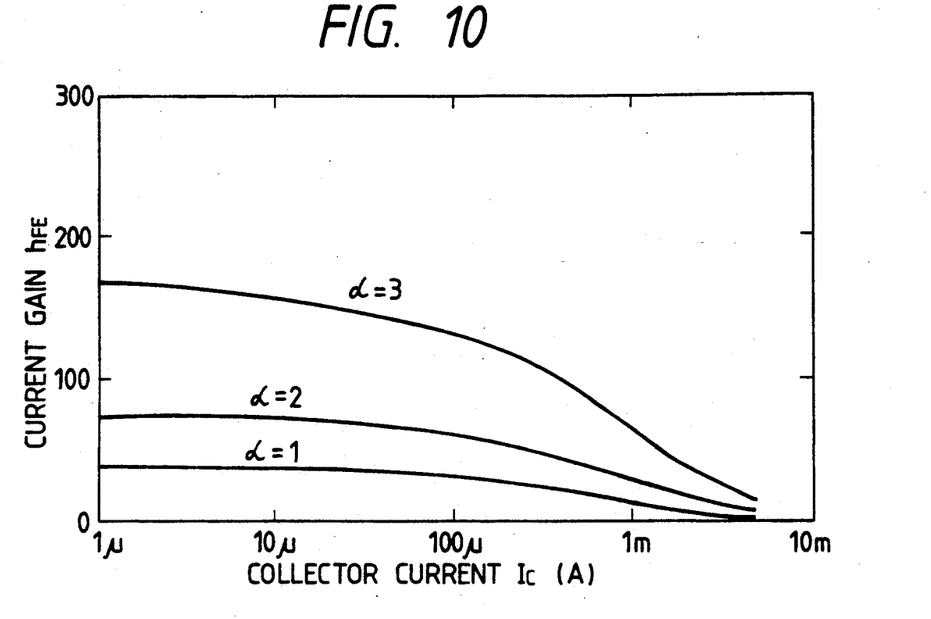
FIGS. 10 through 12 are graphic charts that indicate benefits available with the present invention.
Figure 11:
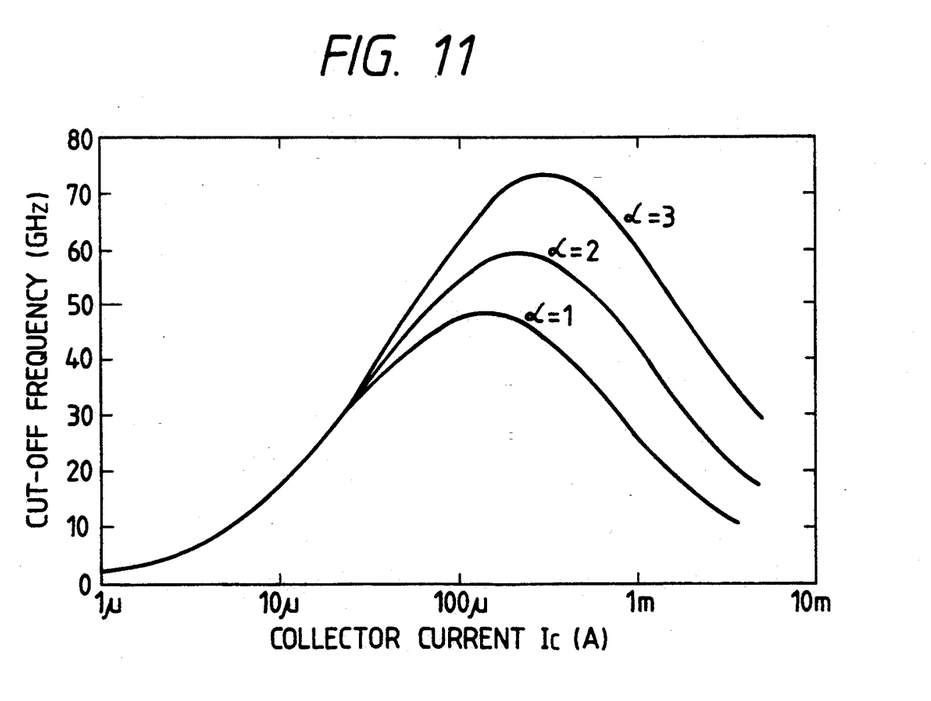

FIGS. 10 and 11 show theoretical results obtained by calculating some of the characteristics of these ideal constructions by use of a computer. FIG. 10 illustrates how curent gain is related to collector curent, and FIG. 11 depicts how cut-off frequency behaves with respect to collector current in these constructions.

A shown in these figures, the greater the value "d", the higher the current gain and the cut-off frequency. The current gain is given by simplified analysis as follows:

$$hFE \propto (XB/XE)^{d-1} \qquad (3)$$

where, XB and XE are the thickness and emitter thickness, respectively. The time constant in effect when d=1 and d=3 is approximated by the expression:

$$\tau(d=3)\tau(d=1) \sim (XB/3 \cdot XE) + 1)/(XB/XE + 1) \qquad (4)$$

Figure 12:
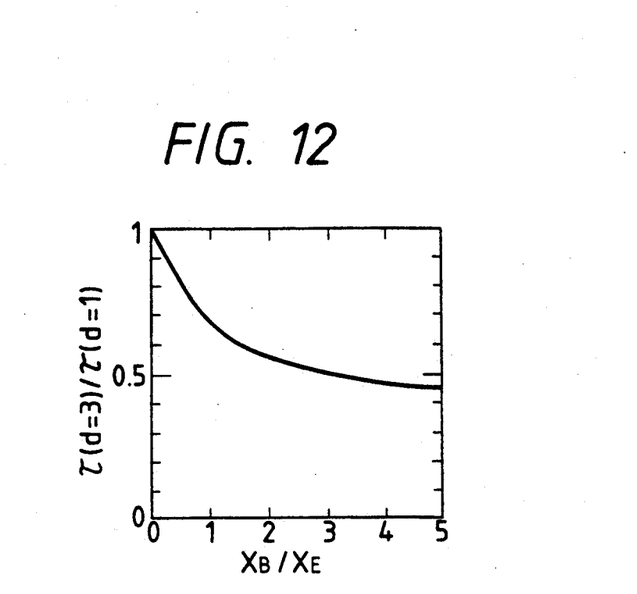

FIG. 12 plots the above function. As indicated, a speed about twice as fast is acquired if XB/XE is 1 or greater. In can be seen from the expression (4) that the time constant becomes one third when XB/XE is allowed to approach its higher limit. This means that a triple operating speed is available.

The transistor characteristics improve with a higher dimension "d" because the collector current gets larger while the amount of the accumulated charge remains virtually constant, as stated earlier. The analysis above reveals that building a transistor construction in which the electrons injected from the emitter are allowed to diffuse as wide as possible boost the transistor characteristics.

Figure 13:
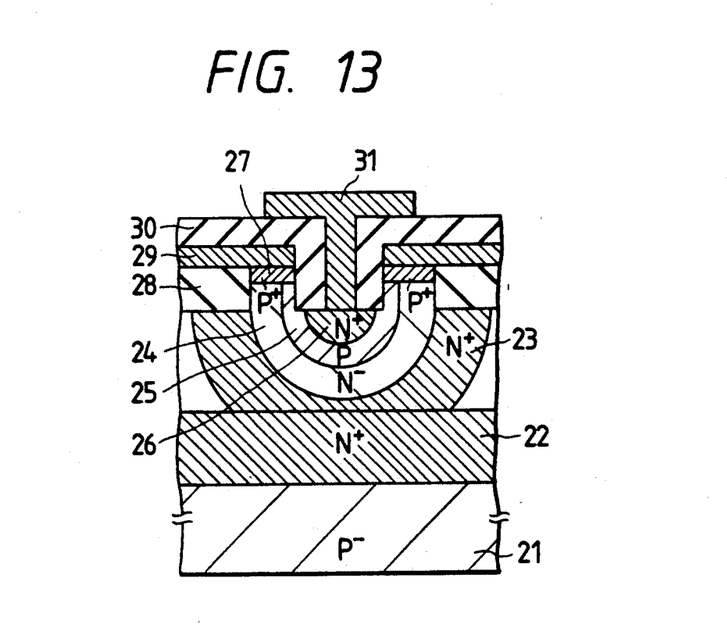
FIGS. 13, 15 and 16 are cross sections showing other embodiments of the present invention.

FIG. 13 is a cross section of a transistor constructed based on the above-mentioned concept. In FIG. 13, only the emitter and its surroundings are indicated, and the remaining regions are omitted because they are substantially identical to those of the prior art transistor shown in FIG. 8.

The highly concentrated N-type layer 22 is formed on the low concentration p-type substrate 21 so as to grow an epitaxial layer. After this, a film 28 is formed and, by ion injection from above, a high concentration N-type layer 23 is formed. After a polycrystalline silicon film 29 containing a large amount of P-type impurities is formed, a high concentration P-type layer 27 is formed by diffusing impurities from the film 29. Then follows the formation of the $SiO_2$ film 30 and the polycrystalline silicon film 31 containing a large amount of N-type impurities. The base 25 and the emitter 26 are formed by diffusing impurities from the film 31. The transistor of FIG. 13 is characterized by the fact that the emitter 25 has an approximately equal distance to the base 25 and to the high concentration N-type layer 23.

Figure 14A:
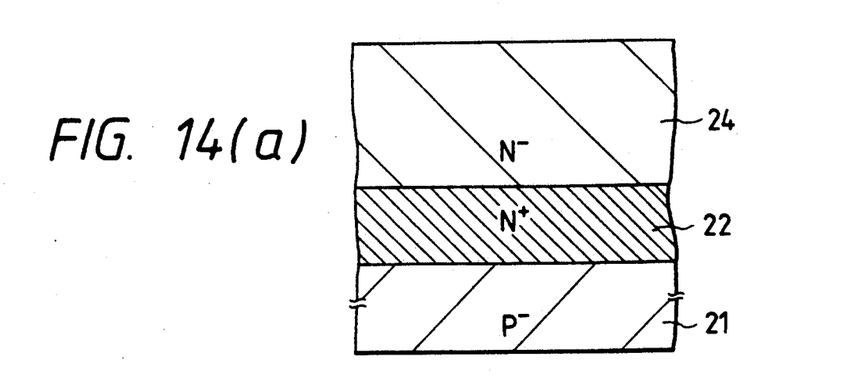

What follows is a detailed description of how the embodiment in FIG. 13 is manufactured by reference to FIGS. 14(a) through 14 (f). The description will proceed by specifically referring to each of these figures.

FIG. 14 (a)

The high concentration N-type layer 22 is conventionally formed on the surface of the low concentration P-type substrate 21. This sixth embodiment utilizes a P-type silicon substrate with a resistivity of $30\Omega.cm$ to which Sb ions are injected and diffused to form an N-type layer 22 having a sheet resistance of $40\Omega.cm^2$. The Sb ions are injected by prior art lithography using a photo-resist mask so that the $N^+$ layer 22 is partially formed on the surface of the substrate 21, as with the prior art example shown in FIG. 8. The Sb ion injection is carried out to apply a dose of $2\times 15^{15}/cm^2$ with an acceleration energy level of 100 keV in a nitrogen atmosphere at 1,175° C. for 60 minutes. Thereafter, the N-epitaxial layer 24 is allowed to grow all over the substrate. With the sixth embodiment, the N−layer 24 develops a thickness of 1 μm.

FIG. 15 (b)

Figure 14B:
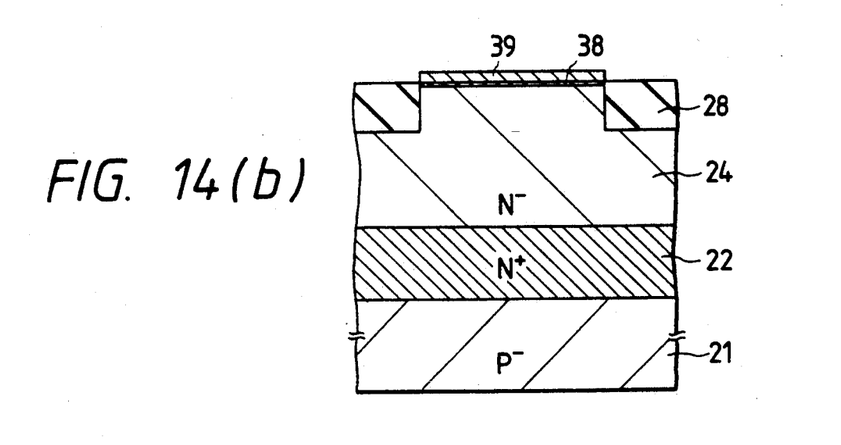

The surface of the silicon substrate 21 is oxidized to form a thin $SiO_2$ film 38 on which an $Si_3N_4$ film 39 is deposited. With the sixth embodiment, the $SiO_2$ film 38 and $Si_3N_4$ film 39 are 50 nm and 120 nm thick, respectively. The $Si_3N_4$ film 39 is patterned by prior art lithography. After this, the $Si_3N_4$ film 39 is used as the mask for oxidizing the surface of the silicon substrate 21, thereby forming the $SiO_2$ film 28. With the sixth embodiment, the film 28 is 300 nm thick.

FIG. 14 (c)

Figure 14C:
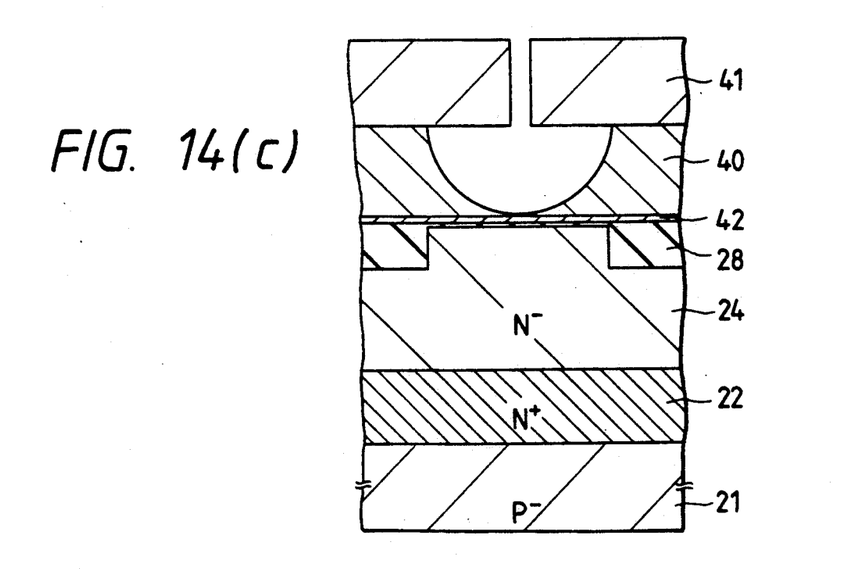

After removal of the $Si_3N_4$ film 39, an $Si_3N_4$ film 42 and an $SiO_2$ film 40 are deposited over the entire surface. With the sixth embodiment, the $Si_3N_4$ film 42 and the $SiO_2$ respectively measure 120 nm and 700 nm in thickness when deposited. The photo-resist film 41 is used as the mask for subjecting the $SiO_2$ film 40 to isotropic etching. At this point, the patterning of the photo-resist film involves forming as small a hole as possible so that a concave-shaped hole is produced on the $SiO_2$ film 40 thereunder. With the sixth embodiment, a plane pattern of 0.3 μm×0.3 μm is used to subject the $SiO_2$ film 40 to 600 nm deep wet etching in the presence of hydrofluoric acid.

FIG. 14 (d)

Figure 14D:
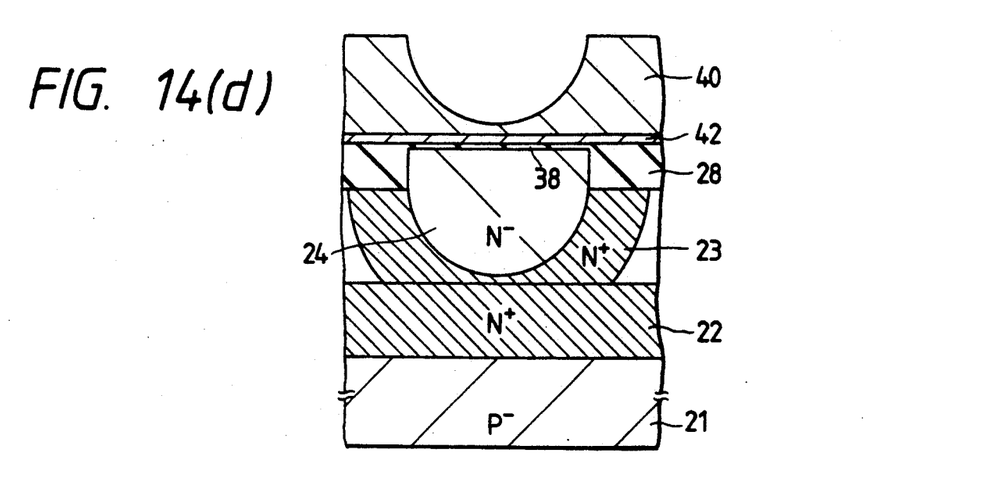

After removal of the photo-resist film 41, the $SiO_2$ film 40 is used as the mask for injecting phosphorus ions. This transfers the cross-sectional shape of the $SiO_2$ film 40 as the impurity distribution pattern onto the epitaxial layer 24. As a result of this, the N-type layer 23 is formed with its center made deep and its circumference shallow. With the sixth embodiment, the phosphorum ion injection is performed for a dose of $1\times 10^{14}/cm^2$ with an acceleration energy level of 500 keV.

FIG. 14 (e)

Figure 14E:
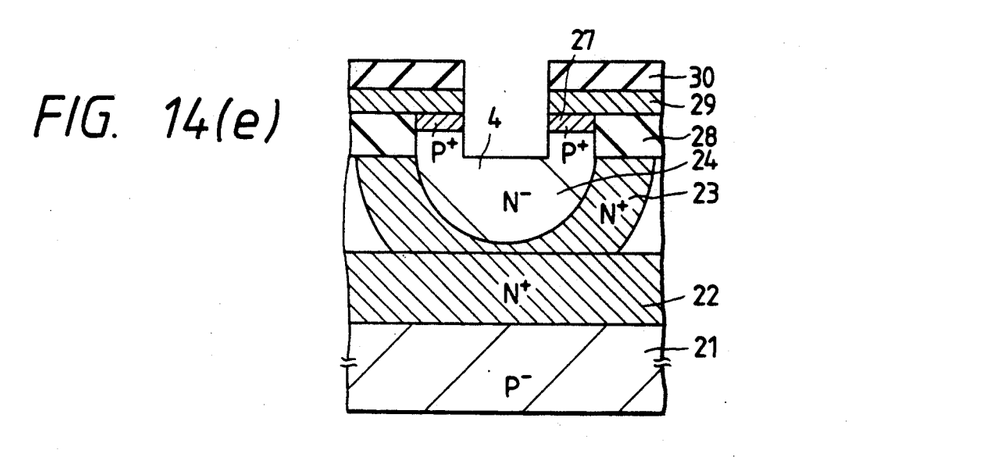

After removal of the $SiO_2$ film 40, $Si_3N_4$ film 42 and $SiO_2$ film 38, the polycrystalline silicon film 29 is deposited over the entire surface. After this, boron ions are injected onto the surface to turn the polycrystalline silicon film 29 into a P-type low resistance layer. With the sixth embodiment, the depositing of a polycrystalline silicon layer 200 nm thick is followed by boron ion injection for a dose of $5\times 15^{15}/cm^2$ with an acceleration energy level of 50 keV. In addition, the $SiO_2$ film 30 is deposited. Thereafter, the boron ions are diffused from the polycrystalline silicon film 29 by heat treatment to form the P-type layer 27. The diffusion for the sixth embodiment is carried out at 950° C. for 30 minutes.

At the center of the transistor, the $SiO_2$ film 30, polycrystalline silicon film 29 and monocrystalline silicone layer 24 are anisotropically etched by lithography in the perpendicular direction. With the sixth embodiment, the $SiO_2$ film 30 develops a thickness of 300 nm when deposited, and the monocrystalline silicon layer 24 is etched to a depth of 150 nm.

FIG. 14 (f)

Figure 14F:
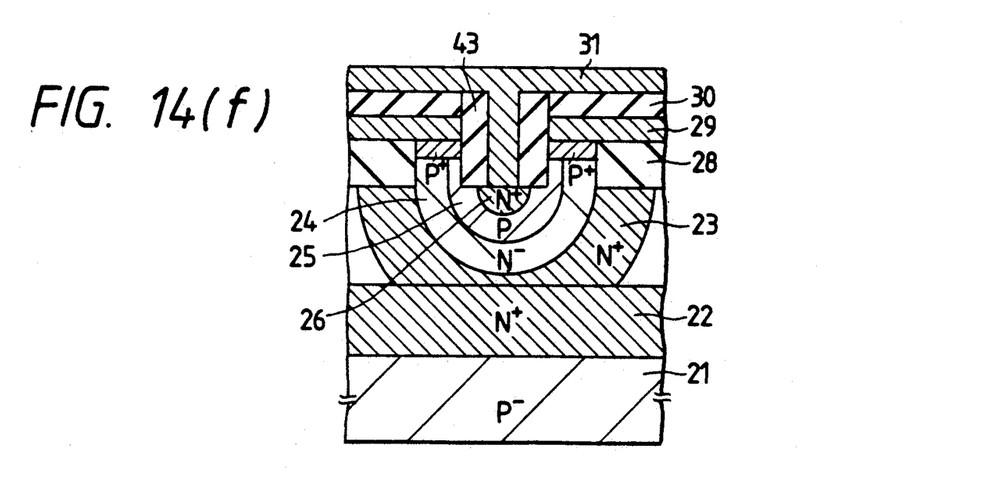

An $SiO_2$ film 43 is deposited over the entire surface. Then anisotropic etching is performed to leave only the side wall of the film 43 intact. The etching is followed by the depositing of the polycrystalline silicon film 31. With the sixth embodiment, the $SiO_2$ film 43 is 200 nm thick, and the polycrystalline silicon film 31 also has a thickness of 200 nm.

Then boron ions are injected into the polycrystalline silicon film 31, and the ions are diffused therefrom to form the base 25. Furthermore, arsenic ions are injected into the polycrystalline silicon film 31, and the ions are likewise diffused therefrom to form the emitter 26.

With the sixth embodiment, the boron ion injection is performed with an acceleration energy level of 30 keV for a dose of $2\times 10^{14}/cm^2$ followed by heat treatment at 950° C. for 20 minutes. The arsenic ion injection is carried out with an acceleration energy level of 80 keV for a dose of $2\times 10^{16}/cm^2$ followed by heat treatment at 950° C. for 20 minutes.

After this, the polycrystalline silicon film 31 is patterned so as to produce the construction of FIG. 13.

Figure 15:
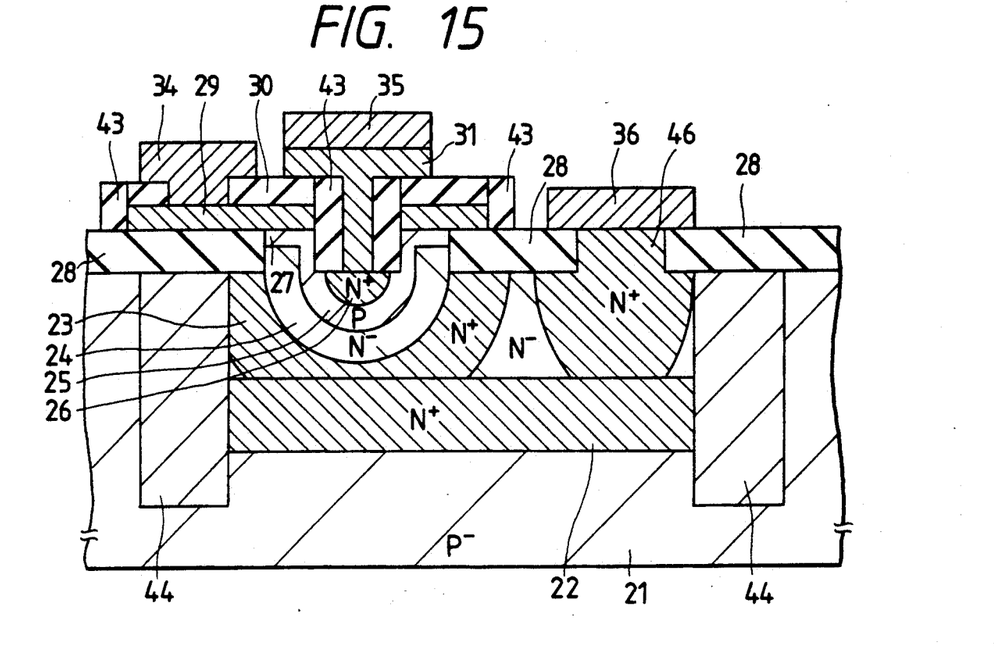

FIG. 15 shows a cross section of the sixth embodiment in its entirety. As illustrated, deep trenches 44 filled with an insulating substance are used to insulate adjacent transistor collectors from one another. Reference numerals 34, 35 and 36 designate a base electrode, an emitter electrode and a collector electrode, respectively.

Figure 16:
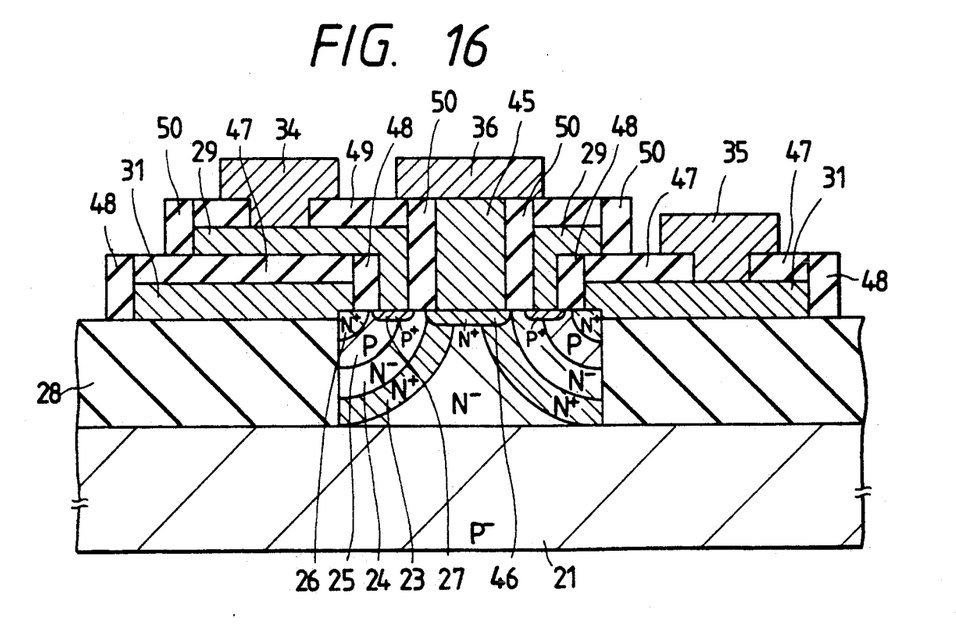

FIG. 16 is a cross section of a seventh embodiment of the invention. In this construction, the emitter 26 is formed in a corner of a monocrystalline silicon island, and the collector is tapped from the center 46 of the island. This embodiment makes it possible to minimize the collector and its outlet, thereby approximately doubling the concentration of integration in chip design.

In this manner, the current gain and cut-off frequency of the bipolar transistor as embodied according to the invention are twice to three times those of the comparable prior art transistor. This advantage translates into 1.5 to 2 times the operating speed for integrated circuits which can in turn implement faster mainframe computers and other improved applications.

It is to be understood that while the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A semiconductor device comprising a plurality of bipolar transistors formed on a surface region of a semiconductor substrate and isolation regions which surround said bipolar transistors to isolate the adjacent ones thereof from one another, said bipolar transistors each comprising a first region which has a first conductivity type, a second region which is formed in the upper surface region of said first region and which as a second conductivity type that is the opposite of said first conductivity type, and a third region which is formed under the lower surface of said first region and which has said second conductivity type, the distance between said second region and said isolation regions being from 0.16 to 0.24 μm when the sum of the depth of said first region and that of said second region is 0.2

μm or less, said distance being from 0.8 to 1.2 times said sum when said sum is more than 0.2 μm.

2. A semiconductor device according to claim 1, wherein said bipolar transistors are downward operation type bipolar transistors, said first, second and third regions representing a base, an emitter and a collector, respectively.

3. A semiconductor device according to claim 1, wherein said bipolar transistors are upward operation type bipolar transistors, said first, second and third regions representing a base, a collector and an emitter, respectively.

4. A semiconductor device according to claim 1, wherein said isolation regions are a trench formed on said semiconductor substrate, the inner surface of said trench being covered with an isolation film.

5. A semiconductor device according to claim 4, wherein said trench is deeper than the lower surface of said third region and is filled with polycrystalline silicon.

6. A semiconductor device according to claim 5, wherein a low resistance buried layer having said second conductivity type is formed under said third region in contact of the lower surface thereof, said trench being deeper than the lower surface of said buried layer.

7. A semiconductor device according to claim 6, wherein a second trench is formed in contact with one side wall of said third region, deeper than the lower surface of said third region, and shallower than said isolation regions, the inner surface of said second trench being covered with an isolation film.

8. A semiconductor device according to claim 1, wherein said first region of at least one of said bipolar transistors comprises an intrinsic base region for said bipolar transistor, and wherein a side wall of said first region is in contact with an extrinsic base region of said at least one bipolar transistor.

9. A semiconductor device according to claim 1, wherein a side wall of said first region of at least one of said bipolar transistors is in contact with an isolation film formed on the surface region of said semiconductor substrate.

* * * * *